US005876882A

United States Patent [19]
Yoda et al.

[11] Patent Number: 5,876,882
[45] Date of Patent: Mar. 2, 1999

[54] METHOD FOR PRODUCING A COLOR FILTER WITH A PHOTOSENSITIVE COATING FILM

[75] Inventors: Eiji Yoda; Toru Nakamura; Hitoshi Yuasa; Yutaka Otsuki, all of Yokohama, Japan

[73] Assignee: Nippon Oil Co., Ltd., Tokyo, Japan

[21] Appl. No.: 759,020

[22] Filed: Dec. 2, 1996

Related U.S. Application Data

[63] Continuation of Ser. No. 573,001, Dec. 15, 1995, abandoned, which is a continuation of Ser. No. 114,647, Aug. 31, 1993, abandoned.

[30] Foreign Application Priority Data

Sep. 8, 1992 [JP] Japan ..................................... 4239800

[51] Int. Cl.⁶ ..................................................... G03F 9/00
[52] U.S. Cl. ........................... 430/7; 430/324; 430/329; 430/331
[58] Field of Search ..................... 430/324, 329, 430/7, 331, 146

[56] References Cited

U.S. PATENT DOCUMENTS

| | | | |
|---|---|---|---|
| 4,479,149 | 10/1984 | Yoshioka et al. | 358/294 |
| 4,580,159 | 4/1986 | Manabe | 427/162 |
| 4,733,096 | 3/1988 | Horiguchi | 355/46 |
| 5,214,541 | 5/1993 | Yamasita et al. | 430/7 |
| 5,214,542 | 5/1993 | Yamasita et al. | 430/7 |
| 5,334,468 | 8/1994 | Yamasita et al. | 430/7 |

Primary Examiner—Maria Nuzzolillo
Assistant Examiner—Laura Weiner
Attorney, Agent, or Firm—Darby & Darby

[57] ABSTRACT

A method for producing a color filter involves (A) forming a photosensitive coating film on at least a transparent electrically conductive layer of a substrate having both the transparent electrically conductive layer and a light-intercepting layer on its outermost surface, and exposing the photosensitive coating film to light in a first irradiation amount through a mask having a predetermined pattern of a certain light transmittance and at least once displacing the mask to another position on the photosensitive coating film and exposing the photosensitive coating film to light in a second irradiation amount different from the first irradiation amount through the mask; and (B) developing and removing a photosensitive coating film portion exposed to light in one of smallest and largest irradiation amounts for exposing the transparent electrically conductive layer and electrodepositing a colored coating on the exposed electrically conductive layer for forming a colored layer thereon, operation of developing and removing the photosensitive coating film and electrodepositing the colored coating being sequentially repeated for the respective irradiation amounts where the sequence of repetition is selected from the group consisting of increasing irradiation amount and decreasing irradiation amount to form different colored layers, respectively.

29 Claims, 4 Drawing Sheets

METHOD FOR PRODUCING A COLOR FILTER WITH A PHOTOSENSITIVE COATING FILM

This is a continuation of application Ser. No. 08/573,001, filed Dec. 15, 1995, now abandoned, which is a continuation of application Ser. No. 08/114,647, filed Aug. 31, 1993 (now abandoned).

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, the substrate is immersed in a colored electrodeposition bath for forming a colored layer by electrodeposition and electrical voltage is applied only to a portion of the patterned transparent electrode which is to be dyed in the same color. The substrate is then immersed in a colored electrodeposition bath for forming a different color layer by electrodeposition, and electric voltage is then applied only to a portion of the substrate which is to be dyed in a different color. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent light exposure and development steps.

In these electrodeposition methods a transparent electrode for formation of colored layers is simultaneously used as an electrode for driving a liquid crystal. However, since the colored layers formed on the transparent electrode is made of an insulating material, the liquid crystal driving voltage becomes exceedingly high. For this reason, a transparent electrode for driving the liquid crystal is additionally provided on the colored layers formed in accordance with the above method for lowering the driving voltage. On the other hand, since the transparent electrode employed in the above method has a light transmittance of 80 to 85%, provision of two transparent electrode layers leads to lowered light transmittance to deteriorate the performance as a colored display substrate. For overcoming this defect, there is proposed in Japanese Laid-open Patent Application No. 1-22479 (1989) a method comprising forming a colored layer on a master plate and transferring it onto a transparent substrate. However, since the transfer is effected for each color with this prior-art method, it becomes necessary to achieve high precision alignment for each transfer operation, thus complicating the production.

On the other hand, in order to meet the demand for high performance of the device provided with a color filter, it has been desired to improve contrast and to prevent color purity from being lowered. In order to solve this problem, a method of forming a non-light transmitting film in a region of the color filter defined between neighboring pixels has been proposed. For forming the non-light transmitting film, there are known a method comprising forming pixels with alignment on a substrate on which a non-light transmitting film pattern is formed previously, and a method comprising forming a non-light transmitting film pattern with alignment on a substrate on which a pixel pattern is formed previously.

However, since it is necessary with these methods to effect an alignment operation between the pixel pattern and the non-light transmitting pattern, it is difficult with this precision to form a pattern of non-light transmitting pattern of a coincident size free of the light transmitting sections between the pixel patterns. If overlapped portions are produced, step differences are produced on a color filter, so that it becomes difficult to produce a color filter excellent in planarity.

With any of the above methods, high precision processing is required for alignment so that it is difficult to cope with the demand for a larger work size, that is a larger picture size with reduced costs.

SUMMARY OF THE INVENTION

It is an object of the present invention to provide a method for producing a color filter in which high precision fine machining technique is not required, the pattern figure of the colored layer has a high degree of freedom, light-intercepting layers can be arrayed without gaps between the color filter pixels and the color filter size may be increased easily and in which mass production may be achieved easily and simply.

It is another object of the present invention to provide a method for producing a color filter which does not require an additional step of forming a transparent electrically conductive layer with light transmittance being not lowered.

It is a further object of the present invention to provide a method for easily producing a color filter having a light-intercepting layer patterned to high precision.

The above and other objects of the invention will become apparent from the following description.

According to the present invention, there is provided a method for producing a color filter comprising the steps of:

(A) forming a photosensitive coating film on at least a transparent electrically conductive layer of a substrate having both said transparent electrically conductive layer and a light-intercepting layer on its outermost surface, and exposing said photosensitive coating film to light in a first irradiation amount through a mask having a predetermined pattern of a certain light transmittance, and at least once displacing said mask to another position on said photosensitive coating film and exposing said photosensitive coating film to light in a second irradiation amount different from said first irradiation amount through said mask; and (B) developing and removing a photosensitive coating film portion exposed to light in one of smallest and largest irradiation amounts for exposing the transparent electrically conductive layer and electrodepositing a colored coating on the exposed electrically conductive layer for forming a colored layer thereon, operation of developing and removing the photosensitive coating film and electrodepositing the colored coating being sequentially repeated for the respective irradiation amounts where said sequence of repetition is selected from the group consisting of increasing irradiation amount and decreasing irradiation amount to form different colored layers, respectively.

PREFERRED EMBODIMENTS OF THE INVENTION

Figure 1:
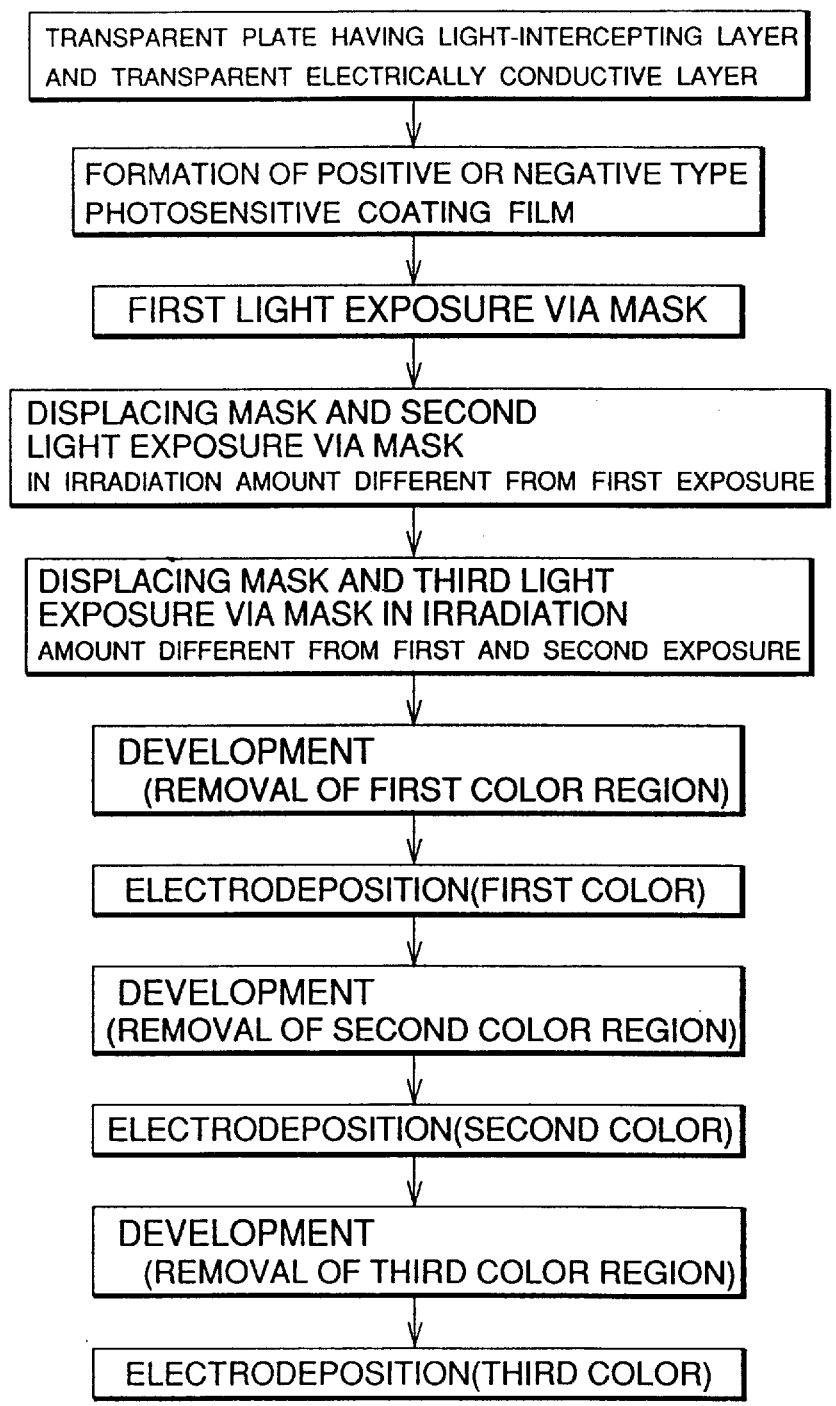
FIG. 1 is a process chart showing an embodiment of the present invention.

In the method for producing a color filter of the present invention, a photosensitive coating film is formed on at least a transparent electrically conductive layer of a substrate having both the transparent electrically conductive layer and the light-intercepting layer on its outermost surface and the photosensitive coating film is exposed to light through a mask having a predetermined pattern of a certain light transmittance in a first irradiation amount. Then the mask is at least once displaced to another position, and the photosensitive coating film is exposed to light in a different second irradiation amount. This step is referred to hereinafter as a step A.

There is no particular limitation to the substrate, if the substrate has both a transparent electrically conductive layer and a light-intercepting layer on its outermost surface. The transparent electrically conductive layer and the light-intercepting layer may be separately formed on the outmost surface of the substrate. Alternatively, the light-intercepting layer may be formed partially on the transparent electrically conductive layer. Conversely, the transparent electrically conductive layer may be formed partially on the light-intercepting layer. To improve the smoothness of the objective color filter, it is preferred to employ the substrate in which the light-intercepting layer is formed partially on the transparent electrically conductive layer. Examples of the substrate may include a glass plate, a laminated plate, a plastic plate, or a plate having a transparent electrically conductive layer and a light-intercepting layer formed on its surface as described above. The substrate preferably has a smooth surface in view of the performance desired of a color filter. The surface of the substrate may be ground if so required.

The transparent electrically conductive layer employed in the present invention may be formed of a material mainly composed of tin oxide, indium oxide, antimony oxide or mixtures thereof, and may preferably be 20 to 300 nm in thickness. There is no particular limitation as to the method of forming the transparent electrically conductive layer and any of the conventional methods, such as spraying, CVD, sputtering or vacuum deposition, may be employed. The transparent electrically conductive layer may preferably be of the highest degree of transparency as possible in view of the performance required of the color filter.

The materials for making the light-intercepting layer to be formed on the substrate and the method for forming the light-intercepting layer are not particularly limited. The known light-intercepting layer materials ordinarily employed such as metal, e.g. tantalm or molybdenum or a compound, e.g. chromium oxide which is vacuum-deposited or sputtered or resin dispersants in which light-intercepting materials such as dyes, pigments, or carbon black are dispersed in resins may be used by the known methods. When the light-intercepting layer is formed partially on the transparent electrically conductive layer and the light-intercepting layer is made of materials having low electrical conductance, a color filter excellent in smoothness is readily available.

The light-intercepting layer may be formed by, for example Cr-photolithographic method, black organic photosensitive material method, black ink printing method, dyeing method and electrodeposition method. Particularly, the Cr-photolithographic method excellent in thermal resistance is preferred. The Cr-photolithographic method involves, for example vacuum-evaporating or sputtering chromium alone or both chromium and chromium oxide on a glass substrate to form a film, and patterning the film by phtolithography with the use of a phothsensitive resist. The black organic photosensitive material method involves dispersing a light-intercepting material such as dyes, pigments or carbon black into a photosensitive resin to prepare a black organic photosensitive material, and forming a patterned light-intercepting layer with the use of the black organic photosensitive material. In the black ink printing method, for example a light-intercepting material such as dyes, pigments or carbon black is dispersed into a vehicle containing ink materials such as oil, solvents, resins, waxes and plasticizers to prepare a black ink. A patterned light-intercepting layer is formed by printing the black ink by offset printing method, intaglio printing method or screen printing method. In the dyeing method, a patterned light-intercepting layer may be formed by dyeing a coloring base such as gelatin, casein, PVA, PVA/vinylpyrrolidone copolymer through a masking layer with the use of black acidic dyes or reactive dyes. In the electrodeposition method, for example where a positive type photosensitive coating film is formed on the surface of a transparent electrically conductive layer by, e.g. spin-coating method or electrodeposition method, exposure is effected through a mask so that the positive type photosensitive coating film portion corresponding to a light-intercepting layer is exposed. The positive type photosensitive coating film of the exposed portions, i.e. corresponding to the light-intercepting layer are removed with an alkali aqueous solution to expose the transparent electrically conductive layer corresponding to the light-intercepting layer. An electrodeposition coating having black-hue and alkali resistance after curing is electrodeposited on the exposed transparent electrically conductive layer followed by drying, curing and exposure of light to the overall surface of the layer. The remaining positive type photosensitive coating film is removed with an alkali aqueous solution. The black coating film thus obtained may be further heated, if necessary. On the other hand, for example where a negative type photosensitive coating film is formed on the surface of a transparent electrically conductive layer by, e.g. spin-coating method or electrodeposition method, exposure is effected through a mask so that the negative type photosensitive coating film portion corresponding to a light-intercepting layer is not exposed. The negative type photosensitive coating film of the unexposed portions, i.e. corresponding to the light-intercepting layer are removed with a developing liquid to expose the transparent electrically conductive layer corresponding to the light-intercepting layer. An electrodeposition coating having black-hue and resistance against a removing agent after curing is electrodeposited on the exposed transparent electrically conductive layer followed by drying, and curing. The remaining negative type photosensitive coating film is removed with a removing agent. The black coating film thus obtained may be further heated, if necessary. The positive type or negative type photosensitive coating film later described may be employed. As the black-hued electrodeposition coating, a coating mixed with black pigments or dyes such as carbon black may preferably be used. Particularly, if the black-hued coating film is dried, e.g. at 80° to 140° C. for 10 to 30 minutes, the electrical conductance of the light-intercepting layer may preferably be lowered for practical use.

Although there is no limitation as to the method of forming the photosensitive coating film on the transparent electrically conductive layer of the substrate, it may be formed by application on the transparent electrically conductive layer by any known methods such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator optionally with dyes and/or pigments may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth) acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be processed with an acidic susbstance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being processed with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterificiation reaction followed by being processed with basic substances e.g. triethylamine, diethylamine, dimethylethanol amine, ammonia or mixtures thereof, and solubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; resin compositions containing these resins; and commercially available positive type photoresist. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth) acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris (acryloyl oxyethyl) isocyanurate, and mixtures thereof. The proportion of these (meth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzylalkyl ketals, benzophenone derivatives, anthraquinone derivatives, thioxanthone derivatives, organic peroxides, trichloromethyl triazine derivatives, bisimidazole derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those-capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone, isophorone or N-methyl pyrrolidone; ethers such as dibutyl ether, dioxane or tetrahydrofuran; alcohols such as methoxy butanol, diacetone alcohol, butanol, octanol or isopropanol; hydrocarbons such as toluene, xylene, cyclohexane or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

The hue of the dyes and/or pigments mixed with the positive type or negative type photosensitive coating may be selected freely depending on objects, if so desired. For example, in order to improve resolution of the photosensitive coating, it is preferred to incorporate dyes absorbing light having wavelength of not less than 400 nm such as oil yellow or ultraviolet ray absorber, e.g. trihydroxy benzophenone to remove light having broad wavelength which exhibits large diffraction upon exposure. Two or more dyes and/or pigments may be mixed to obtain desired hue unless their characteristics are impaired.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 0.1 to 10 wt. % and more preferably 0.5 to 5.0 wt. % based on the total photosensitive coating.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 20 $\mu$m and preferably 1 to 15 $\mu$m. The film thickness may be adjusted by controlling, for example electrodeposition conditions, such as voltage, electrodeposition time and bath temperature. However, film thickness adjustment may be usually made under the same conditions as those for electrodeposition coating of colored coatings, as will be explained subsequently. In case where the negative type photosensitive coating film is used, the film thickness may usually be as thick as approximately 5 to 15 $\mu$m or may be formed to have a thickness of approximately 0.3 to 10 $\mu$m followed by forming an oxygen-barrier film such as polyvinyl alcohol to reduce hardening prevention action due to oxygen and to prevent contamination of the mask or formation of pinholes.

For exposing the photosensitive coating film to light, the substrate is exposed to light through a mask having a predetermined pattern of a certain light transmittance. The mask is then displaced at least once and the photosensitive coating film is exposed to light with an irradiation amount different from that prior to the displacement. By displacement herein is meant changing the relative position between the mask and the substrate. Thus the mask may be moved with the substrate remaining stationary or the substrate may be moved with the mask remaining stationary, or both the substrate and the mask may be moved.

When exposing light at each time, each section of the mask through which light passes (hereinafter referred to "identical mask pattern block or blocks") should correspond to each section on the substrate where there is no light-intercepting layer thereon (hereinafter referred to "identical pixel pattern or patterns") so that the identical pixel patterns are exposed to light as a whole in the same irradiation amount. Accordingly, the mask has to be displaced integral number of times of at least a width of one pixel pattern along the direction of the displacement plus a width of one light-intercepting layer pattern along the direction of the displacement. The mask having a predetermined pattern has identical mask pattern blocks as mentioned above and the size of an identical mask pattern block should correspond completely to or be slightly larger than portions on the substrate (pixels) where there is no light-intercepting layer.

Figure 5:
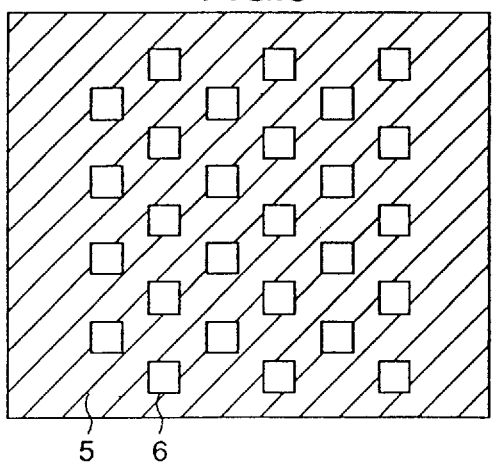
FIG. 5 is an enlarged schematic view showing a mask employed in the Examples of the present invention.
Figure 6:
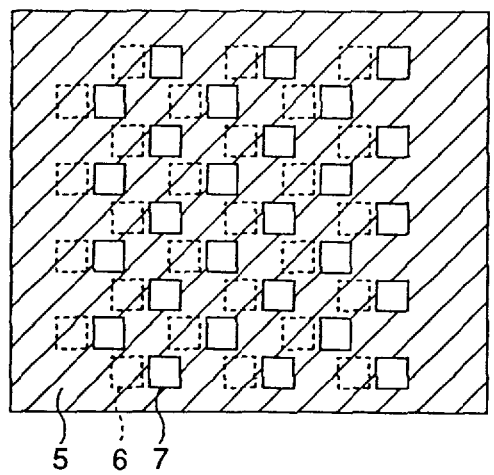
FIG. 6 is an enlarged schematic view employed in Examples of the present invention in which the mask is once displaced laterally.
Figure 7:
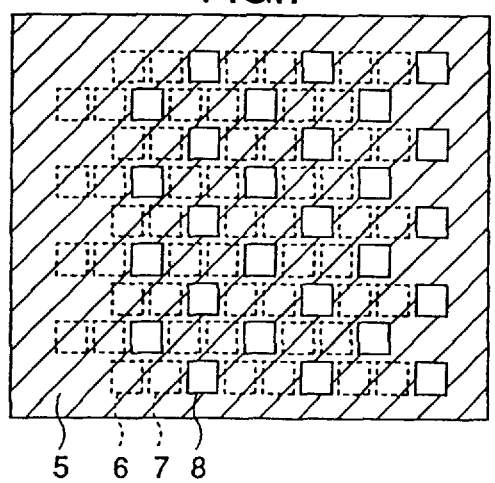
FIG. 7 is an enlarged schematic view employed in Examples of the present invention in which the mask is twice displaced laterally.

Further, upon each light exposure the identical mask patterns need to almost correspond to or cover pixel portions without affecting adjacent pixels. The mask pattern may preferably be the one through which all the pixel portions are exposed to light after all the light exposure steps are performed. Explaining the mask further by referring to the drawings, a first light exposure operation is carried out using the mask having the pattern shown in FIG. 5, and the mask is displaced transversely, as shown in FIG. 6, for exposing the portions of the substrate to light, which have not been exposed to light, with an irradiation amount different from that of the preceding light exposure. The mask is then displaced transversely, as shown in FIG. 7, for exposing the substrate with an irradiation amount different from that of the preceding first and second light exposure operations. Since the pattern blocks are not overlapped during each light exposure operation, the states of light exposure which differ in four stages, inclusive of the portions not exposed to light, are produced.

There is no particular limitation to the directions of the mask displacement which may be the fore-and-aft direction or the transverse direction. The positions and the relative distance of the pattern blocks of the mask may be determined by the size of pixels and the number of times, direction or the distance of the mask displacement.

According to the present invention, the mask is displaced at least once and any desired number of times as a function of the number of the colored layers. If the mask is displaced once, three states of light exposure different in three states may be produced inclusive of the portions not exposed to light. Similarly, if the mask is displaced twice or three times, four or five different states of light exposure may be produced.

According to the present invention, each light exposure operation is carried out in an irradiation amount different from the irradiation amount(s) used in the preceding light exposure operation(s). There is no particular limitation to means for changing the irradiation amounts and any of the methods of changing the light exposure time, the distance of the light source to the substrate or the output of the light source, may be employed.

The difference in the irradiation amounts used in the light exposure operations may be selected depending on the conditions of light exposure and on the developing conditions as later explained. Since a larger relative difference produced by the light irradiation is preferred because a larger difference in solubility relative to the developing solution is thereby produced, it is preferred to increase the irradiation amount of the largest light irradiation amount to diminish the irradiation amount of the smallest light irradiation. Although there is no particular limitation to the relative difference in the irradiation amounts, it is usually preferred to provide a significant relative difference of not less than 5%.

The above-mentioned light exposure may be performed using an apparatus capable of generating a large amount of ultraviolet rays, such as a high pressure mercury lamp, an ultra high pressure mercury lamp or a metal halide lamp. However, a light radiation source generating a radiation other than UV rays may be employed. The conditions for light exposure may be suitably selected depending on the negative or positive type photosensitive coatings, the light exposure devices or the above-mentioned masks.

In the method of the present invention, the operation of developing and removing a photosensitive coating film portion exposed to light in one of the smallest and largest irradiation amounts for exposing the transparent electrically conductive layer and electrodepositing a colored coating on the exposed electrically conductive layer for forming a colored layer thereon. The operations of developing and removing the photosensitive coating film and electrodepositing the colored coating are repeated in the sequence of difference in the irradiation amounts to form plural colored layers, respectively (referred to as a step B). If the photosensitive coating film is a negative type photosensitive coating film, the negative type photosensitive film portions on the substrate in register with the pattern blocks with the smallest irradiation amount are selectively developed and removed, and a colored coating is electrodeposited on the exposed electrically conductive layer to form a colored layer. The negative type photosensitive film portions in register with the pattern blocks of the second smallest irradiation amount are then selectively developed and removed, and a different colored layer is electrodeposited on the newly exposed portions of the electrically conductive layer. These operations are repeated in this sequence a desired number of times for producing a desired number of different colored layers.

If the photosensitive coating film is of a positive type, the positive type photosensitive coating film portions in register with the largest irradiation amounts are selectively developed and removed and a colored coating is electrodeposited on the exposed electrically conductive layer to form a colored layer. The positive type photosensitive coating film portions in register with the second largest irradiation amounts are then selectively developed and removed and a different colored coating is electrodeposited on the newly exposed portions of the electrically conductive layer to form a different colored layer. These operations may be repeated a desired number of times for producing a desired number of different colored layers.

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.05 to 25 wt. %. The developing temperature is usually 10° to 70° C. and preferably 15° to 50° C. and the developing time is usually 2 to 600 seconds and preferably 30 to 300 seconds. As a developing solution in case of employing an anionic resin as a component of the negative type photosensitive coating and in case of employing the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 20 wt. % for development. The development time usually is selected within a range of 2 to 600 and preferably 30 to 300 seconds generally at 10° to 70° C. and preferably 15° to 50° C. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

Where the oxygen-barrier film is formed on the negative type photosensitive coating film, the oxygen-barrier film should be removed in advance of the aforementioned development. The removal of the oxygen-barrier film may be effected in any way depending upon the kinds of the films used. For example, if polyvinyl alcohol is used for forming the film, deionized water or an aqueous solution in which a surface active agent is added to deionized water may be employed as a removing agent. To effect the removal promptly, the removing agent may be heated to 30° to 60° C.

In step B, after the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored coating for improving bath stability or for producing smooth coating films.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methacryloyl groups, cinnamoyl groups or mixtures thereof, that are used in the photosensitive coating film in the step A and that are suited for electrodeposition, may be employed. The above mentioned photopolymerization initiators may also be employed in combination. Resin components for preparation of the colored coating may include highly thermosetting electrodeposition resins such as a mixed resin of acrylic resin and a melamine resin.

The colored coatings employed in step B may be different in type, color hue, color concentration or color brightness in the regions exhibiting different light transmittances. Alternatively, the same colored coatings may be used in common for these regions.

The color hue of the colored coating may be selected suitably, depending on particular applications. For example, the photosensitive coating used in step A, the colored coating used in step B and the colored coatings used in step B in case of repeating the electrodepositing process several times, may be those exhibiting different color hues.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings. Two or more of the aforementioned dyes and/or pigments may be mixed depending on the objective color hue as far as the properties of the dyes and/or pigments are not deteriorated.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agnets are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 30 seconds to 1 hour and preferably 5 to 30 minutes at a tempersture of 150° C. or lower and preferably 60° to 120° C. If the drying temperature is higher than 150° C., the photosensitive coating film is occasionally cured under heat to raise difficulties in the subsequent development process.

The desired color filter may be prepared by the above-mentioned steps A, and B. However, if necessary, heating, curing or photocuring may be carried out for further improving weatherability and resistance to chemicals. The heating or curing conditions include the temperature of from 100° to 250° C. and preferably 150° to 250° C. and the operating time of five minutes to one hour and preferably 15 to 40 minutes.

The process according to embodiments of the present invention will be hereinafter explained by referring to FIGS. 1 to 7. It should be noted that the present invention is not limited to this merely illustrative embodiments.

Figure 2:
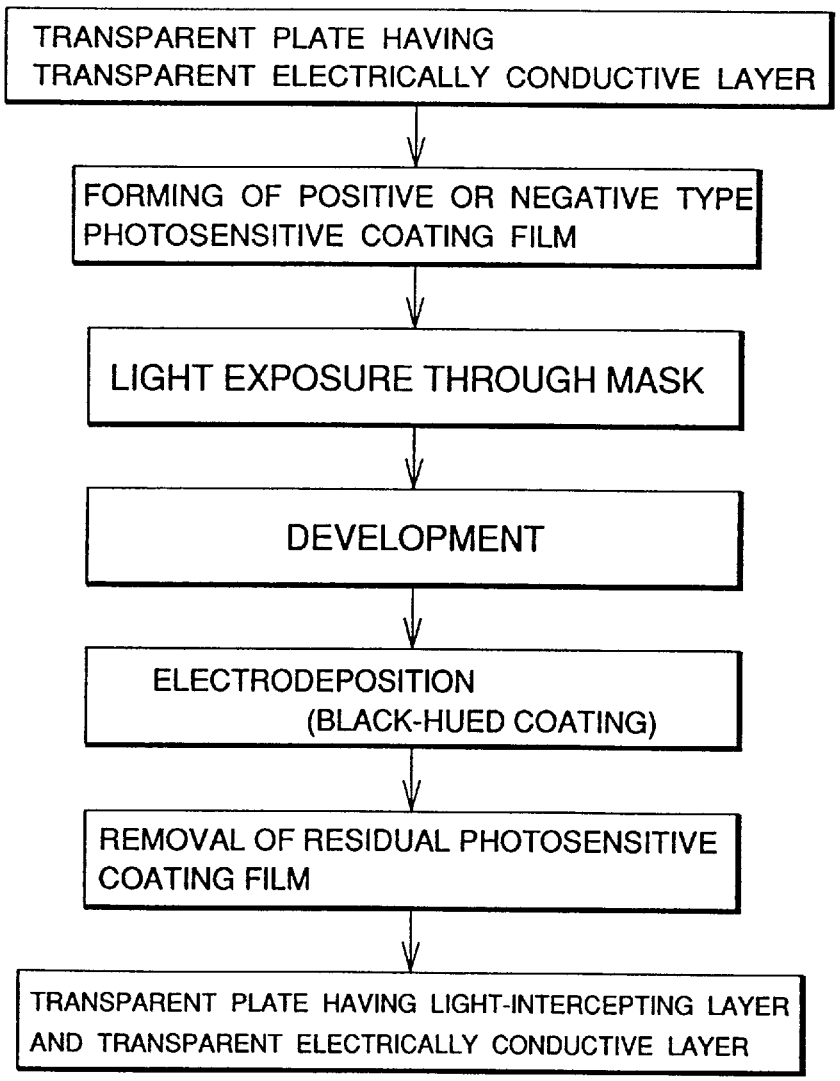
FIG. 2 is a a process chart showing an embodiment of the present invention in which a substrate used in the present invention is produced.
Figure 3:
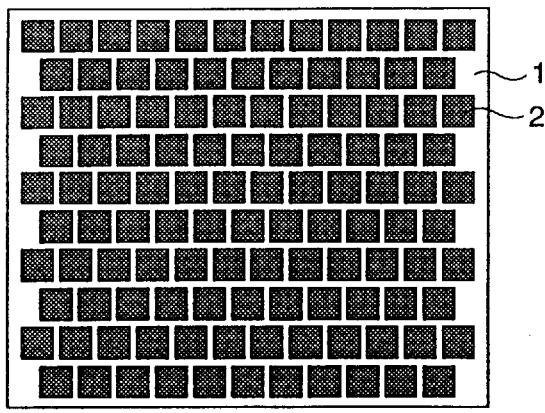
FIG. 3 is an enlarged schematic view of a mask for producing a light-intercepting layer.
Figure 4:
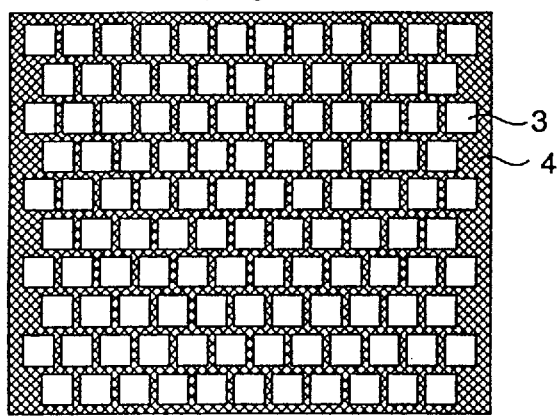
FIG. 4 is an enlarged schematic view of a substrate employed in the present invention.

FIG. 1 shows one embodiment of the present process step by step. FIG. 2 is a diagramatic view showing the steps of producing a transparent substrate having both a light-intercepting layer and a transparent electrically conductive layer shown in FIG. 1 according to one embodiment of the present invention. FIG. 3 is an enlarged schematic view showing a mask for producing a light-intercepting layer partially on the transparent electrically conductive layer. FIG. 4 is an enlarged schematic view showing the transparent substrate having both the light-intercepting layer and the transparent electrically conductive layer produced by using the mask shown in FIG. 3. FIG. 5 shows, in an anlarged schematic view, a mask by which displacement may be performed up to two times with 5 indicating a portion of substantially 0% light-transmittance and 6 indicating pattern blocks of substantially 100% light-transmittance. FIG. 6 is a schematic view of the mask being displaced once laterally with 7 indicating portions to be exposed to light at the second exposure. FIG. 7 is a schematic view of the mask being further laterally displaced from the state shown in FIG. 6 with 8 indicating portions to be exposed to light at the third exposure.

First, a positive type photosensitive coating film is formed on a transparent substrate having a transparent electrically conductive layer thereon. A mask for producing a light-intercepting layer shown in FIG. 3 is placed on the thus formed substrate and exposed to light. Through the mask shown in FIG. 3, a positive type photosensitive coating film portion corresponding to a light-intercepting layer portion 1 is exposed, while a positive type photosensitive coating film portion corresponding to a transparent electrically conductive layer portion 2 is not exposed to light. After exposure, the exposed photosensitive coating film portion (portion 4 in FIG. 4) is developed and removed to expose a transparent electrically conductive layer portion correspond to the light-intercepting layer portion 1. Next, an electrodeposition black coating insoluble into a developing liquid is electrodeposited onto the substrate and dried followed by light exposure on the overall surface. The electrodeposited film is heated to obtain a substrate (hereinafter referred as "substrate 1") in which a black light-intercepting layer 4 is formed partially on the transparent electrically conductive layer.

A negative type or positive type photosensitive coating film is formed on the substrate 1. The substrate 1 is dried and irradiated with light of e.g. 400 mJ, with the interposition of the mask shown in FIG. 5, by way of a first light exposure operation. The mask is then displaced transversly, as shown for example in FIG. 6, and irradiated with the light of e.g. 50 mJ, by way of a second light exposure operation. The mask is then displaced transversely, as shown for example in FIG. 7, and irradiated with the light of e.g. 100 mJ, by way of a third light exposure operation.

A first development operation is then performed, in which the portions irradiated with the smallest amount of light irradiation are developed and removed if the photosensitive coating film is formed using the negative type photosensitive coating, while the portions irradiated with the largest amount of light irradiation are developed and removed if the photosensitive coating film is formed using the positive type photosensitive coating. A colored coating of a first color is electrodeposited on the thus exposed electrically conductive layer to form a colored layer. The substrate thus processed is washed with water.

The second development operation is then carried out under conditions different from those used in the first development operation. At this time, the portions with the second smallest irradiated amounts are developed and removed when the photosensitive coating film is formed using the negative type photosensitive coating and portions with the second largest irradiated amounts are developed and removed when the photosensitive coating film is formed using the positive type photosensitive coating. A colored coating of a second color is electrodeposited on the thus exposed electrically conductive layer to form a colored layer. The substrate 1 is then washed with water.

The third development operation is then carried out under conditions different from those used in the first and second development operations. At this time, the portions with the third smallest irradiated amounts are developed and removed if the photosensitive coating film is formed using the negative type photosensitive coating and the portions with the third largest irradiated amounts are developed and removed if the photosensitive coating film is formed using the positive type photosensitive coating. A colored coating of a third color is electrodeposited on the thus exposed electrically conductive layer to form a colored layer. The substrate 1 is then washed with water.

The fourth development operation is then carried out under conditions different from those used in the first to third development operations. At this time, the portions with the largest irradiated amount are developed and removed if the photosensitive coating film is formed using the negative type photosensitive coating, and the portions with the smallest irradiated amounts are developed and removed if the photosensitive coating film is formed using the positive type photosensitive coating. The substrate 1 is then washed with water to produce the color filter of the invention.

With the method for producing a color filter of the present invention, the degree of freedom in the pattern shape of the colored layers may be increased without requiring fine processing techniques, while the color filter may also be increased in size. Thus, the color filter may be mass-produced relatively easily. Besides, according to the present invention a color filter having a highly precision light-intercepting layer can be produced.

EXAMPLES OF THE INVENTION

The present invention will be explained hereinbelow with reference to Synthesis Examples and Examples which are given only for illustration and are not intended for limiting the invention.

Synthesis Example 1

Synthesis of Cationic Positive Type Photosensitive Resin (X-1)

Synthesis of Unsaturated Compound (x-1)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (x-1).

Synthesis of Cationic Positive Type Photosensitive Resin (x-2)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (x-1), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated throughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (x-2) was produced.

Synthesis of Cationic Positive Type Photosensitive Coating (X-1)

500 g of the cationic positive type photosensitive resin (x-2) were dissolved in 333.3 g of methylethylketone. 11.7 g of acetic acid were added as a neutralizer and the resulting mass was agitated sufficiently and homogenized. As deionized water was added gradually, the resulting mixture was agitated vigorously by a high-speed mixer to effect dispersion in water to prepare an aqueous solution (X-1) of a cationic positive type photosensitive coating (cationic electrodeposition type).

Synthesis Example 2
Synthesis of Anionic Positive Type Photosensitive Coating (X-2)
Synthesis of Anionic Resin (x-3)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/g was produced.

Then, 500 g of the maleinated polybutadiene, 218 g of phenoxyethanol and 205 g of diethylene glycol dimethyl ether were charged into a 2 lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (x-3) containing half ester and imide groups.

Synthesis of Photosensitive Resin (x-4)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOWARD 1000" manufactured by KYOUWA CHEMICAL INDUSTRY CO., LTD. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (x-4).

The produced resin (x-4) in solution contained 150 mg equivalent of naphthoquinone diazido groups per 100 g of resin, and the non-volatile content amounted to 60.0 wt. %.

Synthesis of Anionic Positive Type Photosensitive Resin (x-5)

750 g of the (x-3) resin solution and 670 g of the (x-4) photosensitive resin were mixed thoroughly followed by adding 60 g of triethylamine-for sufficiently neutralization to produce an anionic positive type photosensitive resin (x-5) in solution.

Synthesis of Anionic Positive Type Photosensitive coating (X-2)

Deionized water was added gradually to 500 g of a solution of an anionic positive type photosensitive resin (x-5) and the resulting mixture was agitated vigorously with a high-speed mixer to effect dispersion in water for preparing an aqueous solution of an anionic positive type photosensitive coating (X-2) of an anionic electrodeposition type.

Synthesis Example 3
Synthesis of Cationic Negative Type Photosensitive Coating (X-3)
Synthesis of Amine-added Expoxidated Polybutadiene (x-6)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (x-6) with an amine value of 230.4 mmol/100 g.

Synthesis of Unsaturated Group-Containing Isocyanate Compound (x-7)

435.5 g of 2,4-tolylene diisocyanate and 266.1 g of diethylene glycol dimethyl ether were charged into a 2 lit round-bottom flask, which may be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (x-7).

Synthesis of Cationic Resin (x-8)

500 g of (x-6) were dissolved in 166.7 g of diethylene glycol dimethyl ether in a 2 lit separable flask. 713.4 g of (x-7), in which isocyanate groups are contained in an amount of 0.8 equivalent to 1 equivalent of hydroxyl groups in (x-6), were added dropwise at 40° C., at which temperature the reaction was carried out for one hour. The IR absorption spectral analyses indicated that the isocyanate groups had disappeared. A cationic resin (x-8), in which (x-7) was added to (x-6), was produced.

Synthesis of Cationic Negative Type Photosensitive Coating (X-3)

To 500 g of the cationic resin (x-8) were added 27.0 g of "IRGACURE 907" manufactured by CIBA GEIGY INC. and 3.0 g of "KAYACURE DETX" manufactured by NIPPON KAYAKU CO. LTD., as photopolymerization initiators, under agitation, and 16.7 g of acetic acid were added to the resulting mass as a neutralizer. The resulting mixture was agitated thoroughly and re-homogenization. Deionized water was added gradually to the homogenized mass and the resulting mixture was agitated vigorously by a high-speed mixer to effect dispersion in water to prepare an aqueous solution of the cationic negative type photosensitive coating (X-3) of the cationic electrodeposition type.

Synthesis Example 4

Synthesis of Anionic Negative Type Photosensitive Coating (X-4)

Synthesis of Half-Esterified Product (x-9) solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into a 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g was produced.

Then, 400 g of the maleinated polybutadiene and 188.5 g of diethylene glycol dimethyl ether and 0.4 g of hydroquinone were charged into a 2 lit flask fitted with a reflux cooling tube and the temperature was raised to 80° C. After the mixture was dissolved uniformly, 165.6 g of 2-hydroxyethyl acrylate and 20 g of triethylamine were added and reaction was carried out at 80° C. for two hours to produce a half-esterified product (x-9) in solution. The total acid value of the produced half-esterified product (x-9) in solution was 105 mg KOH/g and the non-voltile content amounted to 75.0 wt. %.

Synthesis of Anionic Negative Type Photosensitive Coating (X-4)

To 500 g of the produced solution of the half ester (x-9) were added 27.0 g of "IRGACURE 907" manufactured by CIBA GEIGY INC. and 3.0 g of "KAYACURE DETX", manufactured by NIPPON KAYAKU CO. LTD., as photopolymerization initiators. To the resulting mass were added 33.7 g of triethylamine as a neutralizer and the resulting mass was agitated thoroughly and re-homogenized. Deionized water was added gradually to the resulting mass and the resulting mixture was agitated vigorously with a high-speed mixture to effect dispersion in water to prepare an aqueous solution of an anionic negative type photosensitive coating (X-4) of the anionic electrodeposition type.

Synthesis Example 5

Preparation of Colored Coatings (Y-1. Y-2 and Y-3)

A solution of the cationic resin (x-8), and pigment were mixed under agitation and dispersed by a laboratory type three-roll roll mill produced by KODAIRA SEISAKUSHO KK untill the pigment reached a particle size of 0.2 μm or less. The particle size was measured using a COULTER counter N4 produced by COULTER INC. To each resulting dispersion mixture was added acetic acid as a neutralizer and each of the mixture was agitated thoroughly for re-homogenization. Each of the resulting masses was despersed in water under gradual addition of deionized water and under agitation vigorously with high-speed mixer, to produce each colored coating (Y-1, Y-2 and Y-3) having a solid concentration of 10 wt %. The compositions of the aqueous solutions of the three-color colored coatings (cationic electrodeposition type) are shown in Table 1, where the numerical figures denote parts by weight.

TABLE 1

| Coating<br>Color | Y-1<br>Red | Y-2<br>Green | Y-3<br>Blue |
|---|---|---|---|
| Cationic resin (x-8) solution | 213.3 | 213.3 | 213.3 |
| Acetic acid (Neutralizer) | 19.8 | 19.8 | 19.8 |
| Phthalocyanine Blue(*) | — | — | 20 |
| Photoalocyanine Green(**) | — | 20 | — |
| Azo Metal Salt Red Pigment(***) | 20 | — | — |

(*)Phthalocyanine Blue "SR-150C" (mfd. by SANYO SHIKISO KK)
(**)Phthalocyanine Green "SAX" (mfd, by SANYO SHIKISO KK)
(***)"PIGMENT RED 4BS" (mfd. by SANYO SHIKISO KK)

Synthesis Example 6

Preparation of Colored Coatings (Y-4, Y-5 and Y-6)

The solution of the half-ester (X-5) and pigment were mixed under agitation and dispersed by a laboratory type three-roll roll mill, manufactured by KODAIRA SEISAKUSHO KK, until the pigment particle size of 0.2 μm or less was reached. The particle size was measured using a COULTER counter N4 manufactured by COULTER INC. To each resulting dispersion mixture was added triethylamine as a neutralizer and the resulting mixture was agitated sufficiently and re-homogenized. Deionized water was added gradually and each resulting mass was agitated vigorously by a high-speed mixer to effect dispersion in water to prepare each of colored coatings (Y-4, Y-5 and Y-6) having a solid concentrations of 10 wt %. The compositions of the aqueous solutions of the three-color colored coatings of the anionic electrodeposition type are shown in Table 2. The numerical values in Table 2 represent parts by weight.

TABLE 2

| Coating<br>Color | Y-4<br>Red | Y-5<br>Green | Y-6<br>Blue |
|---|---|---|---|
| Half Ester (X-5) solution | 213.3 | 213.3 | 213.3 |
| Triethylamine (Neutralizer) | 21.0 | 21.0 | 21.0 |
| Phthalocyanine Blue(*) | — | — | 20 |

TABLE 2-continued

| Coating Color | Y-4 Red | Y-5 Green | Y-6 Blue |
|---|---|---|---|
| Phthalocyanine Green(**) | — | 20 | — |
| Azo Metal Salt Red Piment(***) | 20 | — | — |

(*)"SR-150C" manufactured by SANYO SHIKISO KK
(**)"SAX" manufactured by SANYO SHIKISO KK
(***)"PIGMENT RED 4BS" manufactured by SANYO SHIKISO KK Synthesis Example 7
Preparation of Black-Hued Coating (Y-7)

To 500 g of a solution of the cationic resin (x-8) were added 37.5 g of "CARBON BLACK #5B", produced by MITSUBISHI KASEI CORPORATION, under agitation and the resulting mass was dispersed by a laboratory three-roll roll mill produced by KODAIRA SEISAKUSHO KK, until the carbon black reached a particle size of 0.2 μm or less. The particle size was measured using a COULTER counter N4 produced by a COULTER INC. To the resulting dispersion mixture were added 16.7 g of acetic acid as a neutralizer and agitated thoroughly for re-homogenization. The resulting mass was dispersed in water under gradual addition of dionized water and agitated vigorously by a high-speed mixer to produce a black-hued coating material (Y-7) having a solid concentration of 15 wt. %.

Synthesis Example 8
Preparation of Black-Hued Coating (Y-8)

To 500 g of a solution of the half ester (x-9) were added, under agitation, 37.5 g of "CARBON BLACK #5B" for mixing and the resulting mixture was was dispersed by a laboratory three-roll roll mill, produced by KODAIRA SEISAKUSHO KK until the carbon black reached the particle size of 0.2 μm or less. The particle size was measured using a COULTER counter N4 produced by a COULTER INC. To the resulting dispersion mixture were added 33.7 g of triethylamine as a neutralizer and agitated thoroughly for re-homogenization. The resulting mass was agitated vigorously by a high-speed mixer under gradual addition of deionized water for dispersion in water to produce a colored coating (Y-8) having a solid concentration of 15 wt. %.

Synthesis Example 9
Preparation of Plate (P-1) Having Light-intercepting Layer

The cathionic positive type photosensitive coating (x-2) in a methylethyl ketone solution was applied by spin coating on a Pyrex glass plate of a thickness of 1.1 mm (hereinafter referred to as "master plate G-1") having an ITO film (indium-tin oxide) of 80 nm in film thickness followed by drying at 80° C. for 5 minutes. After cooling, a non-tacky positive type photosensitive coating film of 3.0 μm in film thickness was formed.

Through a mask for producing the light-intercepting layer shown in FIG. 3, i.e. a mask for exposing the positive type photosensitive coating film corresponding to the light-intercepting layer portion 1, UV rays of 500 mJ/cm$^2$ were irradiated using a UV exposure device having a high pressure mercury lamp manufactured by ORC MANUFACTURING CO., LTD. under the trade name of "JL-3300". When developing with a 0.3 wt. % aqueous solution of sodium metasilicate, the positive type photosensitive coating film corresponding to the light-intercepting layer portion 1 (Portion 4 in FIG. 4) was removed to expose the transparent electrically conductive layer. After washing with water and drying, electrodeposition was carried out at 25° C. for 3 minutes with a dc voltage of 25 V with the use of the master plate (G-1) as a cathode and a stainless steel beaker as an anode containing the black-hued coating (Y-7). After washing the master plate (G-1) with ion-exchanged water, the master plate (G-1) was dried for 5 minutes at 80° C. UV rays of 500 mJ/cm$^2$ were irradiated to the overall master plate (G-1) followed by heating the whole plate to 150° C. for 10 minutes. When developing with a 0.3 wt. % aqueous solution of sodium metasilicate, the remaining positive type photosensitive coating film was all removed so that there remained a black-hued light-intercepting layer 4 non-tacky at room temperature having a film thickness of 2 μm, while a transparent electrically conductive layer 3 was exposed in the region on the surface of the master plate (G-1) where there was no light-intercepting layer. With the above steps, a plate (P-1) (FIG. 4) in which the black-hued light-intercepting layer 4 was formed partially on the transparent electrically conductive layer was obtained.

Synthesis Example 10
Preparation of Plate (P-2) Having Light-Intercepting Layer

Using a Pyrex glass substrate (hereinafter referred to as "master plate G-2"), 1.1 mm in thickness, having an indium-tin oxide (ITO) film, 80 nm in thickness, on its surface, as a cathode, and using a stainless steel beaker containing an aqueous solution of the cationic negative type photosensitive coating (X-3), as an anode, electrodeposition was carried out for three minutes at 25° C. at a dc voltage of 25 V. After washing the master plate (G-2) with ion-exchanged water followed by drying at 80° C. for 5 minutes and cooling, a non-tacky coating film, 3 μm in thickness was formed.

Through a mask for producing the light-intercepting layer (not shown), i.e. a mask not exposing the negative type photosensitive coating film corresponding to the light-intercepting layer portion 9, UV rays of 500 mJ/cm$^2$ were irradiated, using a UV exposure device having a high pressure mercury lamp manufactured by ORC MANUFACTURING CO., LTD. under the trade name of "JL-3300". When developing with a 0.25 wt. % aqueous solution of lactic acid, the negative type photosensitive coating film corresponding to the light-intercepting layer portion 9 was removed to expose the transparent electrically conductive layer. After washing with water and drying, electrodeposition was carried out at 25° C. for 3 minutes with a dc voltage of 25 V with the use of the master plate (G-2) as an anode and a stainless steel beaker as a cathode containing the black-hued colored coating (Y-8). After washing the master plate (G-2) with ion-exchanged water, the master plate (G-2) was dried for 5 minutes at 80° C. When developing with a 5.0 wt. % aqueous solution of lactic acid, the remaining negative type photosensitive coating film was all removed followed by heating the overall plate (G-2) for 10 minutes at 150° C. so that there remained a black-hued light-intercepting layer non-tacky at room temperature having a film thickness of 2 μm, while a transparent electrically conductive layer 10 was exposed in the region on the surface of the master plate (G-2) where there was no light-intercepting layer. With the above steps, a plate (P-2) in which the black-hued light-intercepting layer was formed partially on the transparent electrically conductive layer was obtained.

Synthesis Example 11
Preparation of black-Hued coating (Y-9) and Colored Coatings (Y-10, Y-11 and Y-12)

An acrylic resin available under the trade name "ARON S-4030" from TOAGOSEI CHEMICAL INDUSTRY CO., LTD. was neutralized with triethyl amine to give a solution of pH8, to which deionized water was added to prepare a resin aqueous solution (S).

Carbon black, azo metal salt red pigment, phthalocyanine green, and phthalocyanine blue were added under agitation to the resin solution (S), respectively to give pigment despersions of black-hue, red-hue, green-hue and blue-hue.

Separately, a mixture of a melamine resin (tradename "SUMIMAL M-66B" manufactured by SUMITOMO CHEMICAL CO., LTD.) with the aforementioned acrylic resin was neutralized with triethyl amine to have pH8, to which deionized water was added to prepare a resin solution (T).

By adding the resin solution (T) to each of the pigment dispersions, a black-hued coating (Y-9) and colored coatings (Y-10, Y-11, and Y-12) were obtained, which were of thermosetting type and of anionic electrodeposition type.

The compositions are shown in Table 3.

TABLE 3

| | (Parts by weight) | | | |
|---|---|---|---|---|
| Coating | Y-9 | Y-10 | Y-11 | Y-12 |
| Color | Black | Red | Green | Blue |
| Acrylic resin(*) | 750.0 | 750.0 | 750.0 | 750.0 |
| Melamine resin(**) | 250.0 | 250.0 | 250.0 | 250.0 |
| Triethyl amine (Netralizer) | 61.8 | 61.8 | 61.8 | 61.8 |
| Carbon black | 333.0 | — | — | — |
| Phthalocyanine Blue(***) | — | — | — | 300.0 |
| Phthalocyanine Green(****) | — | — | 500.0 | — |
| Azo Metal Salt Red Pigment(*****) | — | 500.0 | — | — |

(*)Acrylic resin "ARON S-4030" (mfd. by TOAGOSE CHEMICAL INDUSTRY CO., LTD.)
(**)Melamine Resin "SUMIMAL M-66B" (mfd. by SUMITOMO CHEMICAL CO., LTD.)
(***)Phthalocyanine Blue "SR-150C" (mfd. by SANYO SHIKISO KK)
(****)Phthalocyanine Green "SAX" (mfd. by SANYO SHIKISO KK)
(*****)Metal Salt Red Pigment "PIGMENT RED 4BS" (mfd. by SANYO SHIKISO KK)

Example 1

With the use, as a cathode, of the plate (P-1) obtained by Synthesis Example 9, referred to hereinafter as a master plate 1, and with the use, as an anode, of a stainless steel beaker, containing an aqueous solution of a cationic positive type photosensitive coating (X-1), electrodeposition was carried—out for 60 seconds with a dc voltage of 40 V and a temperature of 25° C. After washing the master plate 1 with ion-exchanged water, the master plate 1 was dried at 80° C. for five minutes and cooled to form a non-tacky black uniform coating with a film thickness of 2 μm.

A mask shown in FIG. 2 was intimately contacted with the coating film and irradiated with UV rays of 500 mJ/cm² using a UV exposure device having a high pressure mercury lamp, manufactured by ORC MANUFACTURING CO., LTD. under trade name of JL-3300. The mask was then displaced on the coating film transversely to a position shown in FIG. 6 and intimately contacted with the coating film. The mask was then irradiated with UV rays of 50 mJ/cm². The mask was further displaced on the coating film to a position shown in FIG. 7 and intimately contacted with the coating film followed by irradiation with UV rays of 100 mJ/cm².

On development with a 0.3 wt. % aqueous solution of sodium metasilicate, only the portions of the cationic positive type photosensitive coating film irradiated with the largest irradiation amounts were selectively removed to expose the ITO layer. After washing with water and drying, electrodeposition was carried out by applying a d.c. voltage of 25 V was applied at 25° C. for three minutes across the master plate 1 as a cathode and a stainless steel beaker containing a colored coating Y-1 as an anode. After washing the master plate 1 with ion-exchanged water, following by drying at 80° C. for five minutes, a red-hued colored layer, 2 μm in thickness, which was not tacky at ambient temperature, was produced on the master plate portions freed of the coating film.

After development with a 1.3 wt. % aqueous solution of sodium metasilicate, no changes were noticed in the red-hued colored layer 6, while only the positive type photosensitive coating film in register with the portions irradiated with the second largest irradiation amounts were selectively removed. After washing with water and drying, the colored coating Y-2 was electrodeposited for three minutes under conditions of a d.c. voltage of 25 V and a temperature of 25° C., in the same manner as when electrodepositing the colored coating Y-1, and the resulting substrate was washed with ion-exchanged water. It was found that there were no changes in the previously formed red-hued colored layer, and a green-hued colored layer 8 was formed on the master plate portions freed of the coating film. After drying at 80° C. for five minutes and development with a 3.0 wt. % aqueous solution of sodium metasilicate, it was found that no changes were produced in the red-hued or green-hued colored layers, and only the positive type photosensitive coating film portions in register with the portions irradiated with the third largest irradiation amount were selectively removed. After washing with water and drying, a colored coating Y-3 was electrodeposited for three minutes in the same manner as for electrodepositing the colored coating Y-1, under conditions of a d.c. voltage of 25 V and a temperature of 25° C. After washing the master plate 1 with ion-exchanged water, it was found that no changes were produced in the previously formed red-hued or green-hued colored layers, and a blue-hued colored layer 7 was formed on the master plate portions freed of the coating film. After further drying at 80° C. for five minutes and development with a 5.0 wt. % aqueous solution of sodium hydroxide, it was foung that no changes were produced in the colored layers, and the residual cationic positive type photosensitive coating, that is the photosensitive coating film portions in register with the portions irradiated with the smallest irradiation amount, were selectively removed. For completing curing of the colored layers, the master plate 1 was baked at 170° C. for 30 minutes to produce a color filter having the colored layer excellent in transparency and the light-intercepting layer, each having a film thickness of 2 μm.

Example 2

With the use as an anode of the plate (P-1) (hereinafter referred to "master plate 2") obtained by Synthesis Example 9 and with the use as a cathode of a stainless steel beaker containing an aqueous solution of an anionic positive type photosensitive coating (X-2), electrodeposition was carried out for two minutes at a d.c. voltage of 45 V and a temperature of 25° C. After washing the master plate 2 with ion-exchanged water, followed by drying at 80° C. for five minutes, a uniform non-tacky black coating film, having a film thickness of 2 μm, was produced.

A mask shown in FIG. 5 was intimately contacted with the coating film and irradiated with UV rays of 500 mJ/cm² with the use of a UV exposure device manufactured by ORC MANUFACTURING CO., LTD. under the trade name of JL-3300. The mask was then transversly displaced on the coating film to a position shown in FIG. 6 and irradiated with UV rays of 50 mJ/cm² as the mask was intimately contacted with the coating film. The mask was further displaced on the coating film to a position shown in FIG. 7 followed by irradiation of UV rays of 100 mJ/cm² while being intimately contacted with the coating film.

After development with a 0.5 wt. % aqueous solution of sodium metasilicate, only the anionic positive type photosensitive coating film portions in register with the portions irradiated with the largest irradiation amount were selectively removed to expose the electrically conductive layer. After washing with water and drying, electrodeposition was carried out by applying a d.c. voltage of 25 V at 30° C. for three minutes across the master plate 2 as a cathode and a stainless steel beaker containing the colored coating Y-1 as an anode. After washing the master plate 2 with ion-exchanged water and drying at 80° for five minutes, a red-hued colored layer, 2 μm film thickness, which was not tacky at ambient temperature, was formed on the master plate portions freed of the coating film.

Then, after development with a 1.5 wt. % aqueous solution of sodium metasilicate, it was found that no changes were produced in the red-hued colored layer 6, while only the positive type photosensitive coating film portions in register with the portions irradiated with the second largest irradiation amounts were selectively removed. After washing with water and drying, a colored coating Y-2 was electrodeposited for three minutes under conditions of the d.c. voltage of 30 V and a temperature of 25° C., in the same manner as for electrodeposition of the colored coating Y-1. After subsequent washing with ion-exchanged water, it was found that no changes were produced in the previously formed red-hued colored layer 6, and a green-hued colored layer 8 was formed on the master plate portions freed of the coating film. After drying at 80° C. for five minutes and development with a 4.0 wt. % aqueous solution of sodium metasilicate, it was found that no changes were produced in the red-hued and green-hued colored layers and only the positive type photosensitive coating film portions in register with the portions irradiated with the third largest irradiation amount were selectively removed. After washing with water and drying, the colored coating Y-3 was electrodeposited for three minutes at a d.c. voltage of 30 V and a temperature of 25° C. in the same manner as for electrodepositing the colored coating Y-1. After washing the master plate 2 with ion-exchanged water, it was found that no changes were produced in the previously formed red-hued or green-hued colored layers, and a blue-hued colored layer 7 was produced on the master plate portions freed of the coating film.

Then, after drying at 80° C. for five minutes and development with a 7.0 wt. % aqueous solution of sodium metasilicate, it was found that no changes were produced in the colored layers, and only the residual cationic positive type photosensitive coating film, that is the photosensitive coating film portions in register with the portions irradiated with the smallest irradiation amount, were selectively removed. After washing with ion-exchanged water, followed by drying at 80° C. for five minutes and subsequently cooling the master plate 2 having red-hued, green-hued, and blue-hued colored layers as well as a light-intercepting layer was produced.

After baking at 170° C. for 30 minutes to complete curing, a color filter having transparent and homogeneous colored layers, each having film thickness of 2.0 μm was produced.

Example 3

With the use as a cathode of the plate (P-2) obtained by Synthesis Example 10, referred to hereinafter as a master plate 3, and with the use as an anode of a stainless steel beaker containing an aqueous solution of a cationic negative type photosensitive coating (X-3), electrodeposition was carried out for 3 minutes at a d.c. voltage of 30 V and a temperature of 25° C. After washing the master plate 3 with ion-exchanged water, followed by drying at 80° C. for five minutes and subsequent cooling, a non-tacky uniform coating film having a film thickness of 2 μm was produced.

The mask shown in FIG. 5 was intimately contacted with the coating film, and irradiated with UV rays of 500 mJ/cm², using a UV exposure device having a high-pressure mercury lamp, manufactured by ORC MANUFACTURING CO., LTD. under the trade name of JL-3300. The mask was then displaced transversely on the coating film to a position shown in FIG. 6 and irradiated with UV rays of 50 mJ/cm² as the mask was intimately contacted with the coating film. The mask was then displaced on the coating film to a position shown in FIG. 7, and irradiated with UV rays of 100 mJ/cm², as the mask was intimately contacted with the coating film.

Then, after development with a 0.1 wt. % aqueous solution of lactic acid, only the cationic negative type photosensitive coating film portions in register with the portions irradiated with the smallest irradiation amount, i.e. non-objective excess photosensitive film portions were selectively removed.

Then, after development with a 0.5 wt. % aqueous solution of lactic acid, no changes were noticed in the black-hued colored layer 5, whilst only the negative type photosensitive coating film portions in register with the portions irradiated with the second smallest irradiation amount were selectively removed. After washing with water and drying, the colored coating Y-4 was electrodeposited for three minutes under conditions of a d.c. voltage of 25 V and a temperature of 25° C. After washing with ion-exchanged water, it was found that a red-hued colored layer 7 was formed on the master plate portions freed of the coating film. After drying at 80° C. for five minutes and development with a 3.0 wt. % of lactic acid, it was found that no changes were produced in the red-hued colored layer and only the negative type photosensitive coating film portions in register with the portions irradiated with the third smallest irradiation amount were selectively removed. After washing with water and drying, the colored coating Y-5 was electrodeposited for three minutes under conditions of a d.c. voltage of 25 V and a temperature of 25° C. in the same manner as for electrodeposition of the colored coating Y-4. After washing the master plate 3 with ion-exchanged water, it was found that no changes were produced in the previously formed red-hued colored layer and a green-hued colored layer was formed in the master plate portions freed of the coating film.

Then, after drying at 80° C. for five minutes, and development with a 7.0 wt. % aqueous solution of lactic acid, no changes were noticed in the colored layers, and only the residual cationic negative type photosensitive coating film, that is the photosensitive coating film portions in register with the portions irradiated with the largest irradiation amount, were selectively removed. After electrodeposition for three mites at 25° C. with the d.c. voltage of 25 V, using the exposing surface as an anode and a stainless steel beaker containing the colored coating Y-6 as a cathode, washing the master plate 3 with ion-exchanged water and drying at 80° C. for five minutes, the master plate 3 in which a blue-hued colored layer 6 having a film thickness of 2 μm and not showing tackiness at ambient temperature was produced in the master plate portions freed of the coating film and which had the red-hued colored layer, the green-hued colored layer and the blue-hued colored layer, was produced. By baking at 170° C. for 30 minutes to complete the curing, a color filter having the light-intercepting layer, and the colored layers, each 1.9 μm in film thickness, showing excellent transparency and uniformity, could be obtained.

Example 4

By electrodeposition for three minutes under conditions of a d.c. voltage of 25 V and a temperature of 25° C., with the use as an anode of the plate (P-2) obtained by Synthesis Example 10, hereinafter referred to as a master plate 4, and with the use as a cathode of a stainless steel beaker containing an aqueous solution of an anionic negative type photosensitive coating (X-4), followed by washing of the master plate 4 with ion-exchanged water, drying at 80° C. for five minutes and cooling, a non-tacky uniform coating film with a film thickness of 1.8 μm was produced.

The mask shown in FIG. 5 was intimately contacted with the coating film and irradiated with UV rays of 600 mJ/cm$^2$, using a UV exposure device having a high-pressure mercury lamp, manufactured by ORC MANUFACTURING CO., LTD. under the trade name of JL-3300. The mask was then displaced transversely on the coating film to a position shown in FIG. 6, and irradiated with UV rays of 50 mJ/cm$^2$, as the mask was intimately contacted with the coating film. The mask was then displaced on the coating film to a position shown in FIG. 7, and irradiated with UV rays of 100 mJ/cm$^2$, as the mask was intimately contacted with the coating film.

Then, after development with a 0.1 wt. % aqueous solution of sodium carbonate, only the anionic negative type photosensitive coating film portions in register with the portions irradiated with the smallest irradiation amount, i.e. non-objective excess photosensitive coating film portions were selectively removed.

Then, after development with a 0.75 wt. % aqueous solution of sodium carbonate, no changes were notived in the light-intercepting layer, and only the negative type photosensitive coating film portions in register with the portions irradiated with the second smallest irradiation amount were selectively removed. After washing with water and drying, the colored coating Y-2 was electrodeposited for three minutes under the conditions of a d.c. voltage of 25 V and a temperature of 25° C. After washing with ion-exchanged water, a green-hued colored layer was formed on the portions freed of the coating film. After drying at 80° C. for five minutes and development with a 5.0 wt. % aqueous solution of sodium metasilicate, no changes were noticed in the green-hued colored layer, and only the negative type photosensitive coating film portions in register with the portions irradiated with the third smallest irradiation amount were selectively removed. After washing with water and drying, the colored coating Y-3 was electrodeposited for three minutes under conditions of a d.c voltage of 30 V and the temperature of 25° C., in the same manner as for electrodeposition of the colored coating Y-2. After washing the master plate 4 with ion-exchanged water, it was found that no changes were produced in the previously formed green-hued colored layer, and a blue-hued colored layer 8 was formed in the portions freed of the coating film.

Then, after drying at 80° C. for five minutes and development with a 9.0 wt. % aqueous solution of sodium metasilicate, it was found that no changes were produced in the colored layers and the residual anionic negative type photosensitive coating, that is the photosensitive coating film portions in register with the portions irradiated with the largest irradiation amount, were selectively removed. After washing with water and drying, the colored coating Y-1 was electrodeposited for three minutes at 25° C. at a d.c. voltage of 30 V in the same manner as for electrodepositing the colored coating Y-2. After washing the master plate 4 with ion-exchanged water, the master plate 4 in which a red-hued colored layer 6 was formed in the portions freed of the coating film and which had the green-hued and red-hued colored layers, was produced. After baking at 175° C. for 30 minutes to complete the curing, a color filter having the light-intercepting layer and the colored layers, each 1.9 μm in film thickness and having excellent transparency and uniformity was produced.

Example 5

A positive type photoresist available under the tradename "OFPR-800" from TOKYO OHKA KOGYO KK was applied by a spin coater onto a Pyrex glass plate, 0.7 mm in thickness, having an ITO film of a film thickness of 100 nm on the glass plate followed by drying at 80° C. for 10 minutes to form a photosensitive coating film having a film thickness of 2.5 μm (hereinafter referred to as "a master plate 5").

Through a mask for producing the light-intercepting layer shown in FIG. 3, i.e. a mask for exposing the positive type photosensitive coating film corresponding to the light-intercepting layer portion 1, UV rays of 75 mJ/cm$^2$ were irradiated using a UV exposure device having a high pressure mercury lamp manufactured by ORC MANUFACTURING CO., LTD. under the trade name of "JL-3300". When developing with a 2.4 wt. % aqueous solution of tetramethyl ammonium hydroxide, the positive type photosensitive coating film corresponding to the light-intercepting layer portion 1 was removed to expose the transparent electrically conductive layer (ITO film). After washing with water and drying, electrodeposition was carried out at 25° C. for 3 minutes with a dc voltage of 40 V with the use of the master plate 5 as a cathode and a stainless steel beaker as an anode containing the black-hued anionic electrodeposition coating (Y-9). After washing the master plate 5 with ion-exchanged water, the master plate 5 was dried for 10 minutes at 120° C. UV rays of 75 mJ/cm$^2$ were irradiated to the overall master plate 5 followed by heating the whole plate to 150° C. for 10 minutes. When developing with a 2.4 wt. % aqueous solution of tetramethyl ammonium hydroxide, the remaining positive type photosensitive coating film was all removed so that there remained a black-hued light-intercepting layer non-tacky at room temperature having a film thickness of 2 μm, while a transparent electrically conductive layer was exposed in the region on the surface of the master plate 5 where there was no light-intercepting layer. The master plate was further heated for 30 minutes at 180° C. to cure the black-hued light-intercepting layer. A plate 5 in which the black-hued light-intercepting layer was formed partially on the transparent electrically conductive layer was obtained.

A positive type photoresist (TOKYO OHKA KOGYO KK, "OFPR-800") was applied by a spin-coater onto the surface of the electrically conductive layer and the black-hued light-intercepting layer on the plate 5 followed by drying at 80° C. for 10 minutes to form a photosensitive coating film having a film thickness of 2.5 μm.

A mask shown in FIG. 5 was intimately contacted with the coating film and irradiated with UV rays of 70 mJ/cm$^2$ using a UV exposure device similar to Example 1. Then the mask was displaced to the position shown in FIG. 6, 20 mJ/cm$^2$ of UV rays were irradiated to the photosensitive coating film while intinately contacted.

On development with a 2.4 wt. % aqueous solution of tetramethyl ammonium hydroxide, the photosensitive coating film portions corresponding to the largest light-transmittance portion of the mask were selectively removed to expose the ITO film. After washing with water and drying, electrodeposition was carried out for 20 seconds by applying a d.c. voltage of 28 V across the plate 5 as an anode and a stainless steel beaker containing a colored coating Y-10 as a cathode. After washing the plate 5 with ion-exchanged water, followed by drying at 120° C. for 10 minutes to be partially cured, a red-hued colored layer was produced on the plate.

After development with a 3.5 wt. % aqueous solution of tetramethyl ammonium hydroxide, no changes were noticed in the red-hued colored layer, while only the positive type photosensitive coating film in register with the second largest light-transmittance portion of the mask were selectively removed. After washing with water and drying, the colored coating Y-11 was electrodeposited for 40 seconds under conditions of a d.c. voltage of 25 V and a temperature of 25° C., in the same manner as when electrodepositing the colored coating Y-10, and the resulting plate was washed with ion-exchanged water. It was found that there were no changes in the previously formed red-hued colored layer, and a green-hued colored layer was formed on the plate portions freed of the coating film. After drying at 120° C. for 10 minutes to partially cure the colored layer, 75 mJ/cm$^2$ of UV rays were irradiated on the overall surface of the plate 5.

After development with a 2.4 wt. % aqueous solution of tetramethyl ammonium hydroxide, it was found that no changes were produced in the red-hued or green-hued colored layers, and only the positive type photosensitive coating film portions in register with the smallest light transmittance portion of the mask were selectively removed. After washing with water and drying, a colored coating Y-12 was electrodeposited for 20 seconds in the same manner as for electrodepositing the colored coating Y-10, under conditions of a d.c. voltage of 22 V and a temperature of 25° C. After washing the plate 5 with ion-exchanged water, it was found that no changes were produced in the previously formed red-hued or green-hued colored layers, and a blue-hued colored layer was formed on the plate portions freed of the coating film. For completing curing, the red, green and blue-hued colored layers were baked at 180° C. for 30 minutes to produce a color filter having the colored layers and the light-intercepting black-hued layer, each having a film thickness of 2 μm±0.1 μm, excellent in transparency and homogeneity.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising:
   (A) providing a substrate, one surface of which has a transparent electrically conductive layer deposited thereon, and a light-intercepting layer deposited on said transparent electrically conductive layer having defined openings leaving access to said transparent electrically conductive layer,
   (B) subsequently forming a photosensitive coating film to cover at least said transparent electrically conductive layer accessible through said defined openings of said light-intercepting layer,
   (C) exposing said photosensitive coating film in said defined opening of said light-intercepting layer that covers said transparent electrically conductive layer through a mask having a predetermined pattern of a single light transmittance to light of a first irradiation amount,
   (D) performing a series of steps of the following D.1 and D.2 one or more times,
      D.1 moving said mask relative to said substrate to a different position from the position at which said mask has been previously placed,
      D.2 exposing said photosensitive coating film in another opening of said light-intercepting layer that overlies said transparent electrically conductive layer that has not been covered by said light-intercepting layer through said mask to light of an irradiation amount while in said different position,
   wherein the irradiation amount of said light of exposure in step (C) and each different exposure in step (D) is different from each other irradiation amount, and
   (E) subjecting each of the exposed portions of said photosensitive coating film to a series of steps of the following E.1 and E.2,
      E.1 developing said exposed portion of said photosensitive coating film to uncover a region of said transparent electrically conductive layer under the portion, and
      E.2 electrodepositing a colored coating on said uncovered region of the transparent electrically conductive layer for forming a colored layer thereon; and
   wherein the order of subjecting the portions to said series of steps E.1 and E.2 in (E) is the order from the portion which has been exposed to said light with the largest irradiation amount in steps (C) and (D) to the portion which has been exposed to said light with the smallest irradiation amount.

2. The method as claimed in claim 1 further comprising a step of photocuring all of said colored layers after said step (E) is performed.

3. The method as claimed in claim 1 wherein said light-intercepting layer has low electrical conductions.

4. The method as claimed in claim 1 wherein said light-intercepting layer is formed by a method selected from the group consisting of Cr-photolithographic method, black organic photosensitive material method, black ink printing method, dying method and electrodeposition method.

5. The method as claimed in claim 1 wherein said photosensitive coating film is formed by a method selected from the group consisting of electrodeposition, spraying, dip coating, roll coating, screen printing and spin coating.

6. The method as claimed in claim 1 wherein said photosensitive coating film is formed of a positive photosensitive coating containing (a) a positive photosensitive coating resin which is capable of forming a coating film having photosensitivity, and (b) a solvent selected from the group consisting of an organic solvent and water.

7. The method as claimed in claim 6 wherein said positive photosensitive coating resin is a quinone diazido group-containing cationic resin obtained by introducing an onium group and a hydroxyl group into a main resin, adding a quinone diazido sulfonic acid compound by esterification reaction and neutralizing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, and said acidic material being selected from the group consisting of formic acid, acetic acid, propionic acid, lactic acid and mixtures thereof.

8. The method as claimed in claim 6 wherein said positive photosensitive coating resin is a quinone diazido group-containing anionic resin obtained by introducing a carboxyl group and a hydroxyl group into a main resin, adding a quinone diazido sulfonic acid compound by esterification reaction and neutralizing with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

9. The method as claimed in claim 6 wherein said positive photosensitive coating resin is a quinone diazido group-containing resin obtained by reacting a resin which is capable of forming a coating film and a hydroxyl group-containing compound with a quinone diazido compound, said quinone diazido compound being selected from the group consisting of a quinone diazido sulfonic acid derivative-containing quinone diazido compound and an isocyanate group-containing quinone azido compound.

10. The method as claimed in claim 6 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

11. The method as claimed in claim 6 wherein said positive photosensitive coating contains a colorant selected from the group consisting of dyes, pigments and mixtures thereof.

12. The method as claimed in claim 11 wherein said dye is selected from the group consisting of azo dyes, anthraquinone dyes, benzodifuranone dyes, condensed methine dyes and mixtures thereof.

13. The method as claimed in claim 11 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green emerald green, carbon black and mixtures thereof.

14. The method as claimed in claim 11 wherein 0.1 to 10 wt. % of said colorant is contained based on total weight of said positive type photosensitive coating.

15. The method as claimed in claim 1 wherein said mask has a light-transmitting portion and a non light-transmitting portion.

16. The method as claimed in claim 15 wherein said mask has such a width between said light-transmitting portion and said non light-transmitting portion adjacent to said light-transmitting portion that when said mask is displaced, said light-transmitting portion is not overlapped with said non light-transmitting portion.

17. The method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

18. The method as claimed in claim 17 wherein said acidic material is selected from the group consisting of formic acid, acetic acid, propionic acid, lactic acid, hydrochloric acid, phosphoric acid and mixtures thereof.

19. The method as claimed in claim 17 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

20. The method as claimed in claim 1 wherein said photosensitive coating film is developed and removed under conditions of a temperature of 10° to 70° C. and a developing time of 2 to 600 seconds.

21. The method as claimed in claim 1 wherein said colored coating is obtained by neutralizing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigment and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

22. The method as claimed in claim 21 wherein said cationic resin is obtained by introducing an onium group into a main resin, said main resin being selected from the group consisting of acrylic resin, polyester resin, maleinated oil resin, epoxy resin, urethane resin, polybutadiene resin, polyamide resin and mixtures thereof, and said onium group being selected from the group consisting of an amino group, an ammonium group, a sulfonium group and mixtures thereof.

23. The method as claimed in claim 21 wherein said anionic resin is obtained by introducing a carboxy group into a main resin selected from the group consisting of acrylic resin, polyester resin, maleinated oil resin, polybutadiene resin, epoxy resin, urethane resin, polyamide resin and mixtures thereof.

24. The method as claimed in claim 21 wherein said photocurable resin contains a functional group selected from the group consisting of an acryloyl group, a methacryloyl group, a cinnamoyl group and mixtures thereof in a molecule thereof.

25. The method as claimed in claim 21 wherein said photocurable resin comprises a photopolymerization initiator selected from the group consisting of benzoins, benzoin ethers, benzilalkyl ketals, benzophenone, anthraquinone, thioxanthone, organic peroxides, trichloromethyl triazine, bisimidazole and mixtures thereof.

26. The method as claimed in claim 21 wherein said dye is selected from the group consisting of azo dyes, anthraquinone dyes, benzodifuranone dyes, condensed methine dyes and mixtures thereof.

27. The method as claimed in claim 21 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white carbon black and mixtures thereof.

28. The method as claimed in clam 1 wherein said colored coating is electrodeposited at an electrical voltage of 5 to 500 V dc for a time interval of 5 to 300 seconds and at a liquid temperature of 10° to 35° C.

29. A method as claimed in claim 1 further comprising the step of curing said colored layers of all of said exposed portions by heating at 100° to 250° C. for 5 minutes to one hour after said step (B) is performed.

* * * * *